(12) United States Patent
Heussler et al.

(10) Patent No.: US 9,400,432 B2
(45) Date of Patent: Jul. 26, 2016

(54) LITHOGRAPHY METHOD AND APPARATUS

(75) Inventors: Sascha Pierre Heussler, Singapore (SG); Herbert O. Moser, Karlsruhe (DE)

(73) Assignee: National University of Singapore, Singapore (SG)

( * ) Notice: Subject to any disclaimer, the term of this patent is extended or adjusted under 35 U.S.C. 154(b) by 338 days.

(21) Appl. No.: 13/881,546

(22) PCT Filed: Oct. 25, 2011

(86) PCT No.: PCT/SG2011/000376
§ 371 (c)(1),
(2), (4) Date: Apr. 25, 2013

(87) PCT Pub. No.: WO2012/057707
PCT Pub. Date: May 3, 2012

(65) Prior Publication Data
US 2013/0215406 A1    Aug. 22, 2013

Related U.S. Application Data

(60) Provisional application No. 61/407,502, filed on Oct. 28, 2010.

(51) Int. Cl.
*G03F 7/20*     (2006.01)
*G02B 5/18*     (2006.01)
(Continued)

(52) U.S. Cl.
CPC .............. *G03F 7/70058* (2013.01); *G02B 5/18* (2013.01); *G03F 7/0005* (2013.01);
(Continued)

(58) Field of Classification Search
CPC .............. G03F 7/7035; G03F 7/70066; G03F 7/70883; G03F 7/70625; G03F 7/0005; G03F 7/0037; G03F 7/2014; G03F 7/203; G03F 7/213; G03F 7/70058; G02B 5/18
USPC .............................. 355/77, 78, 84; 378/34, 35
See application file for complete search history.

(56) References Cited

U.S. PATENT DOCUMENTS 4,348,105 A * 9/1982 Caprari .............. G03F 7/70058
                                                     353/102
5,828,492 A * 10/1998 Moser et al. .................. 359/575
(Continued)

FOREIGN PATENT DOCUMENTS

EP    0765488 A1    4/1997
JP    H04196513 A   7/1992
(Continued)

OTHER PUBLICATIONS

Machine translation of JP 3380878, published Dec. 20, 2002.*
(Continued)

*Primary Examiner* — Steven H Whitesell Gordon
(74) *Attorney, Agent, or Firm* — Lerner, David, Littenberg, Krumholz & Mentlik, LLP

(57) ABSTRACT

A lithography method and apparatus is disclosed herein. In a described embodiment, the method comprises (i) providing a first mask having an exposure pattern for forming a three dimensional structure; (ii) exposing the first mask to radiation to form the exposure pattern on a radiation-sensitive resist; the exposure pattern defined by irradiated areas and non-irradiated areas of the resist; (ii) providing a second mask; and (iii) during exposure, changing relative positions between the first mask and the second mask to shield selected portions of the irradiated areas from radiation to enable varying depth profiles to be created in the three dimensional structure.

20 Claims, 13 Drawing Sheets

(51) Int. Cl.
  *G03F 7/00* (2006.01)
  *G03F 7/213* (2006.01)
(52) U.S. Cl.
  CPC ........... *G03F 7/0017* (2013.01); *G03F 7/0037* (2013.01); *G03F 7/203* (2013.01); *G03F 7/2014* (2013.01); *G03F 7/213* (2013.01)

(56) References Cited

U.S. PATENT DOCUMENTS

| | | | | |
|---|---|---|---|---|
| 5,854,671 | A * | 12/1998 | Nishi | 355/53 |
| 6,121,625 | A | 9/2000 | Ito et al. | |
| 6,295,119 | B1 * | 9/2001 | Suzuki | 355/53 |
| 6,441,383 | B1 | 8/2002 | Ito et al. | |
| 7,106,418 | B2 * | 9/2006 | Jen | G03F 7/70358 355/53 |
| 7,649,615 | B2 * | 1/2010 | Case | G03F 7/702383 355/53 |
| 2005/0062949 | A1 * | 3/2005 | Irie | 355/53 |
| 2005/0100827 | A1 | 5/2005 | Liao et al. | |
| 2007/0018286 | A1 | 1/2007 | Chen | |

FOREIGN PATENT DOCUMENTS

| | | |
|---|---|---|
| JP | H08124829 A | 5/1996 |
| JP | H08250446 A | 9/1996 |
| JP | H08330220 A | 12/1996 |
| JP | H10335215 A | 12/1998 |
| JP | 2002236371 A | 8/2002 |
| JP | 3380878 B2 | 2/2003 |
| JP | 2007027742 A | 2/2007 |
| JP | 2007079458 A | 3/2007 |
| JP | 2008089617 A | 4/2008 |
| JP | 2009069592 A | 4/2009 |
| WO | 9535516 A1 | 12/1995 |
| WO | 03065427 A1 | 8/2003 |

OTHER PUBLICATIONS

International Search Report and Writen Opinion dated Dec. 19, 2011 for Application No. PCT/SG2011/000376.

M. Fukuda, K. Deguchi, M. Suzuki, Y. Utsumi, Three-Dimensional patterning using fine step motion in synchroton radiation lithography, American Vacuum Society, © 2006.

N. Rizvi, P. Apte, "Developments in laser micro-machining techniques," Journal of Materials Processing Technology 127, 2002, 206-210.

E. Harvey and P. Rumsby, "Fabrication Techniques and their application to produce novel Micromachined Structures and Devices using Excimer Laser Projection," 1997.

Hirai et al., "Moving mask UV lithography for three-dimensional structuring," Journal of Micromechanics and Microengineering, 17, 199-206, 2007.

Katoh et al., "Direct writing for three-dimensional microfabrication using synchrotron radiation etching," Sensors and Actuators, A 89, 10-15, 2001.

* cited by examiner

LITHOGRAPHY METHOD AND APPARATUS

CROSS REFERENCE TO RELATED APPLICATIONS

The present application is a national phase entry under 35 U.S.C. §371 of International Application No. PCT/SG2011/000376 filed Oct. 25, 2011, published in English, which claims the benefit of the filing date of U.S. Provisional Patent Application No. 61/407,502 filed Oct. 28, 2010, the disclosures of which are hereby incorporated herein by reference.

BACKGROUND AND FIELD OF THE INVENTION

This invention relates to a lithography method and apparatus, more particularly but not exclusively, for fabricating 3-dimensional micro or nanostructures.

Over the past decades, progress in micro-fabrication processes has fueled the development of compact, small, lightweight, fast, reliable, and inexpensive sensors and actuators, thus opening up a huge variety of applications in science and industries. With these small sensors and actuators, portable or handheld measurement devices such as miniature spectrometers become possible. These handheld or portable measurement devices enable on-site measurements and this has created a new, rapidly evolving technology with a growing demand. Besides having a plethora of devices developed for the visible and near infrared part of the electromagnetic spectrum, infrared spectrometers that cover larger portions of the infrared range like mid-infrared (MIR) and far-infrared (FIR) offer a huge variety of applications, ranging from quantitative to qualitative analysis of substances needed in chemical, food, pharmaceutical, recycling, petroleum and hydrocarbon processing industries.

The workhorse among such IR spectrometers is the Fourier transform interferometer (FTIR). They are based on interferometers like the Michelson interferometer in which optical components such as mirrors are mechanically scanned to cover a certain spectral range. However, when it comes to measuring time-dependent processes and, in particular, short non-repetitive pulsed signals, the time needed for a mechanical scanning cycle restricts such FTIRs to rather slow processes. Furthermore, the mechanical scanning also leads to an inherent sensitivity to mechanical vibrations which may corrupt the spectral information. Furthermore, Michelson-type FTIRs, the most commonly-used interferometer, inherently reflect 50% of the source radiation back to the source without making use of it. On the other hand, another type of spectrometers which are grating and filter based, allow static and fast detection but are limited to narrow spectral bands. Moreover, the dispersion of light into its spectral components as in the case of grating spectrometers results in less sensitivity to detect small signals (no multiplexing).

It is an object of the present invention to provide a lithography method and apparatus which may be used to fabricate a three dimensional structure for use in an application described above and which addresses at least one of the disadvantages of the prior art and/or to provide the public with a useful choice.

SUMMARY OF THE INVENTION

In accordance with a first aspect of the present invention, there is provided a lithography method comprising (i) providing a first mask having an exposure pattern for forming a three dimensional structure; (ii) exposing the first mask to radiation to form the exposure pattern in a radiation-sensitive resist; the exposure pattern defined by irradiated areas and non-irradiated areas of the radiation-sensitive resist; (ii) providing a second mask; and (iii) during exposure, changing relative positions between the first mask and the second mask to shield selected portions of the irradiated areas from radiation to enable varying depth profiles to be created in the three dimensional structure.

The radiation may be X-rays or UV light. It may also be particle beams formed from electrons or ions. The resist may be deposited on a suitable substrate such as a silicon wafer.

An advantage of the described embodiment is that a more accurate and precise selection of portions of the radiation-sensitive resist may be achieved. This results in fabricating the three dimensional structure having multi-level surfaces or arbitrary surfaces of varying depths with high-aspect-ratios and step heights possibly in the range of <100 nm to >1000 μm. The aspect ratio is defined as the ratio between the structure depth and the smallest structure detail. High aspect ratios are usually considered to be significantly larger than one, eventually going up to several 100. Preferred ratios might be 6 or 7. Since the proposed method is particularly useful for forming or fabricating three dimensional structures with great precision and accuracy, this may be useful in the manufacture of optical devices which are capable of manipulating electromagnetic waves for interferometry and spectroscopy. In particular, such a method may be used to fabricate a multi-mirror array for use in fast parallel-processing Fourier transform interferometers (FPP FTIR) which have single-pulse measurement capability. By and large, arbitrary multilevel plane surfaces may also be useful for manipulating the time structure of light waves and have applications in laser technology, telecommunication or in holography.

Preferably, the first mask is in contact with the resist and the second mask is arranged above the first mask. In other words, the first and second masks are positioned at different vertical or Z coordinates.

The method may further comprise changing the relative positions at intervals. In the alternative, the method may comprise changing the relative positions continuously. Either way, changing the relative positions may include maintaining the position of the second mask and moving together both the first mask and the resist. In this case, the method may further comprise moving both the first mask and the resist along a first movement axis and subsequently, along a second movement axis which is orthogonal to the first movement axis.

Alternatively, changing the relative positions may include maintaining the positions of the first mask and the resist, and moving the position of the second mask. In this case, the method may include moving the second mask along a first movement axis and subsequently, along a second movement axis which is orthogonal to the first movement axis.

It is also possible that one of the masks may perform an azimuthal movement. For example, the method may comprise rotating the second mask about a central point. In one embodiment, the second mask may include two opposing apertures and the apertures may be lozenge-shaped. Indeed, the apertures may just be one aperture or more than two depending on the size of the mask.

The lithography method may comprise two or more masks and thus, it is envisaged that the method may comprise providing a third mask. For such a preferred feature, the method may further comprise moving the second mask along a first movement axis and moving the third mask along a second movement axis which is orthogonal to the first movement axis, while maintaining the positions of the first mask and the resist.

Advantageously, the exposure pattern includes a lamellar structure, for example, in the case of a multi-mirror array.

The lithography method may further comprise, after exposure, developing the resist in a developer solution to etch away parts of the irradiated areas to form the three dimensional structure having varying depth profiles.

The radiation is preferred X-ray although other forms of radiation, for example, UV, is also envisaged. The resist may be polymer and a preferred resist is Poly Methyl MethAcrylate (PMMA). Specifically, the lithography may be photolithography or Deep X-ray (DXRL) lithography.

The three dimensional structure produced by the lithography method may be used to produce micro or nano structures and thus, in a second aspect, there is provided a method of producing a micro or nano structure from a three dimensional structure obtained from the lithography method. The method may further comprise forming a mould from the three dimensional structure and then producing the micro or nanostructure based on the mould.

An example of a micro/nano structure is a grating structure and in a third aspect, there is provided a grating structure obtained from the method of producing the micro/nano structure, the grating structure comprising an array of lamellar grating cells arranged on different surface areas having varying structure heights. Such a grating structure may be used as a multi-mirror array, which may be part of a Fourier spectrometer.

In a fourth aspect, there is provided a lithography apparatus comprising (i) a first mask having an exposure pattern for forming a three dimensional structure, (ii) a second mask; (ii) a radiation source for exposing the first mask to radiation for forming the exposure pattern on a radiation-sensitive resist; the exposure pattern defined by irradiated areas and non-irradiated areas of the resist; and (iii) means for changing relative positions between the first mask and the second mask for shielding selected portions of the irradiated areas from radiation to enable varying depth profiles to be created in the three dimensional structure.

It should be appreciated that features relating to one aspect may also be applicable to the other aspects.

BRIEF DESCRIPTION OF THE DRAWINGS

Examples of the invention will now be described with reference to the accompanying drawings, in which:

FIG. 3b is a side perspective view of the apparatus of FIG. 3a;

DETAILED DESCRIPTION OF PREFERRED EMBODIMENT

Figure 1:
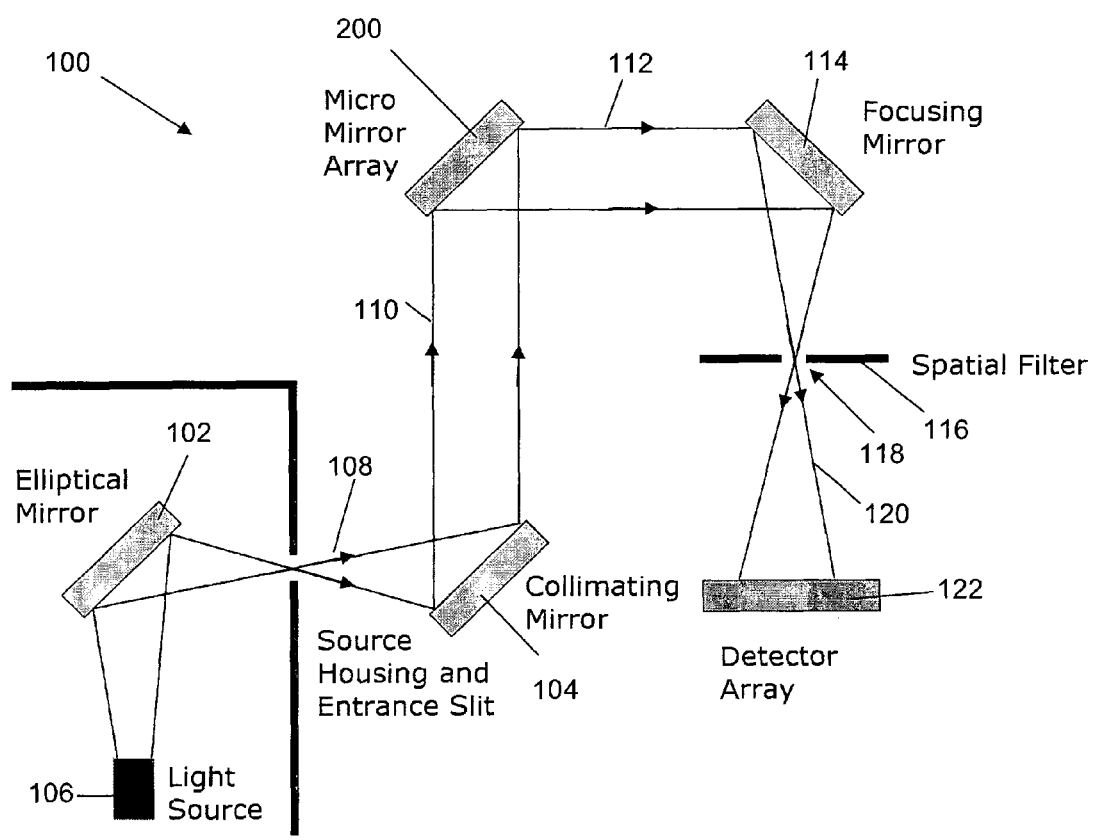
FIG. 1 is a schematic diagram of an exemplary Fast and Parallel Processing (FPP) FTIR setup employing a Multi-Mirror Array (MMA)

FIG. 1 is a schematic diagram of an exemplary Fast and Parallel Processing (FPP) FTIR spectrometer 100 comprising a mirror arrangement including an elliptical mirror 102 and a collimating mirror 104. The elliptical mirror 102 is arranged to reflect and condense light emitted from an object or light source 106 towards the collimating mirror 104. The collimating mirror 104 forms an approximately parallel light beam 110 from the reflected light 108 and directs the beam to a Multi-Mirror Array (MMA) 200.

Figure 2:
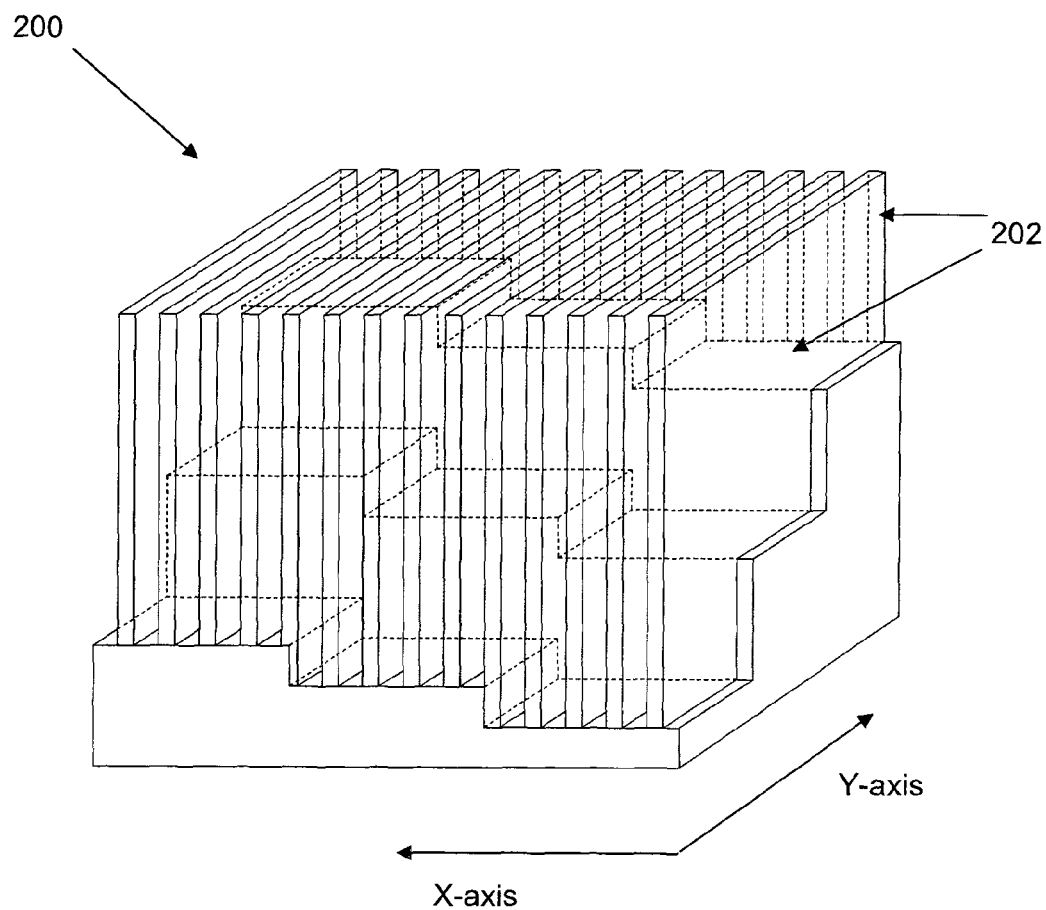
FIG. 2 is a magnified schematic diagram of the MMA of FIG. 1.

FIG. 2 illustrates a schematic diagram of the MMA 200 which includes N×M binary grating cells 202 having surfaces of distinct and varying heights or depths and arranged in a chessboard-like array. A cell is the area and the lamellar superstructure belonging to one individual level of the stepped chessboard-like surface. Each of the cells 202 differ from adjacent cells in its individual distance between front and back facet mirrors and thus, each cell creates a specific optical path which differs from the optical path of the next cell. Upon reflection by the MMA, the array of grating cells 202 split the collimated light beam 110 into respective sub-beams 112, each one of which is modulated in amplitude with respect to the corresponding optical path of the grating cells 202. The sub-beams 112 are directed to a focusing mirror 114 which focuses the sub-beams 112 to a spatial filter 116 having an aperture opening 118. The spatial filter 116 is configured to filter spatially higher diffraction orders of the sub-beam 112 while allowing zero$^{th}$ order radiation to pass through the aperture opening 118 as filtered light beams 120 towards a detector 122 located at a distance from the spatial filter 116. The focusing mirror 114 simultaneously images the surface of the MMA 200 onto the surface of the detector 122. The detector 122 includes an array of detector cells (not shown) each of which measures one single intensity point of each filtered light beam. Since the filtered light beams 120 have different optical paths (created by the MMA 200), the optical path difference of each filtered light beam is derivable from the position of the intensity points or spots on the detector 122. The intensities and respective optical path differences of the filtered light beams 120 collectively form an interferogram. Subsequently, the interferogram undergoes a Fourier transformation to yield a spectrum, usually either transmittance or absorbance of the sample versus wavelength or wavenumber or frequency of the light. Needless to say, the N×M array may be N×N (i.e. having equal number of cells along each axis).

It would be apparent that the FPP FTIR spectrometer 100 is not limited by a time-consuming scanning mechanism or by a narrow spectral working band. The spectrometer 100 is able to use the full flux of the incoming light signal from the object 106 and has an advantage of having a static MMA 200. The absence of moving parts in the spectrometer 100 creates a compact and sturdy design while offering capability to detect very short non-repetitive pulses, typical of explosions, flames, electrical discharges, plasma processes, lightning, spectroscopic scanning and sorting of large number of objects, flowing toxic or flammable gases, and the like. Such processes are of high significance in monitoring and diagnosing internal combustion, jet engines, fires, environment pollution, waste treatment, toxic gas hazards, chemical reactions, and explosives, which are related to clean energy and environment, safety, security, warfare, civil defence and homeland security. The spectrometer 200 maintains the advantages of FTIRs in terms of wide spectral range, throughput, and multiplexing capability. In addition, it avoids the 50% intensity loss by the beamsplitter used in state-of-the-art FTIRs.

It should be appreciated that accurate manufacturing of the MMA 200 in particular the grating cells' mirror surfaces is of great importance. A method of forming multilevel surfaces such as the grating cells of the MMA 200 by lithography will now be described.

Figure 3A:
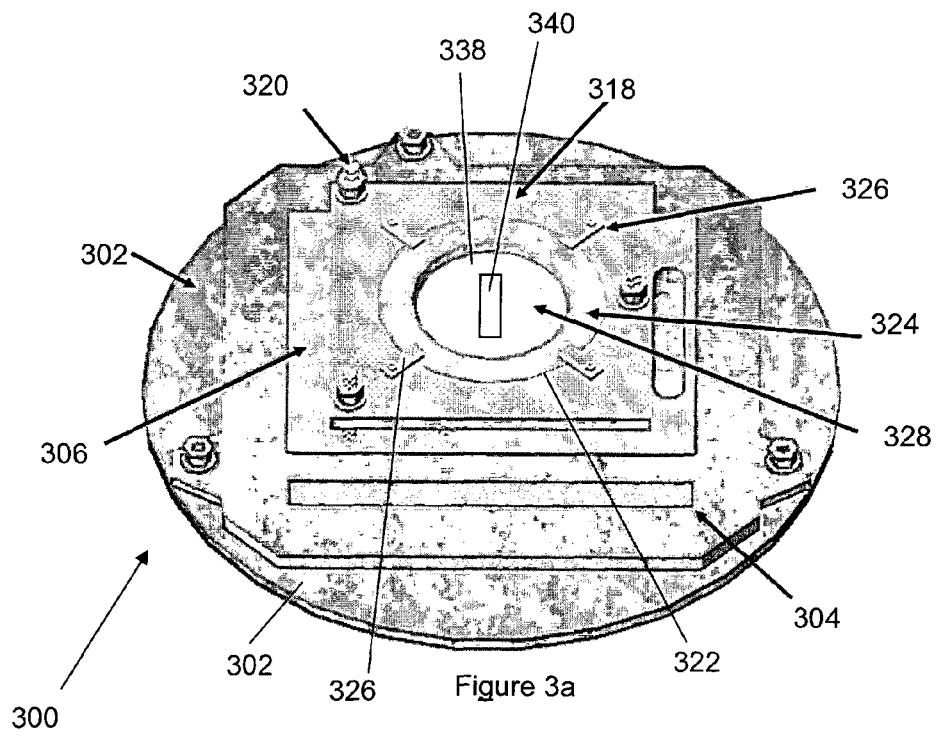
FIG. 3a is a top view of an apparatus having a double mask arrangement for performing an exposure stage of a lithography method for forming multilevel surfaces such as the MMA of FIG. 2.
Figure 3B:
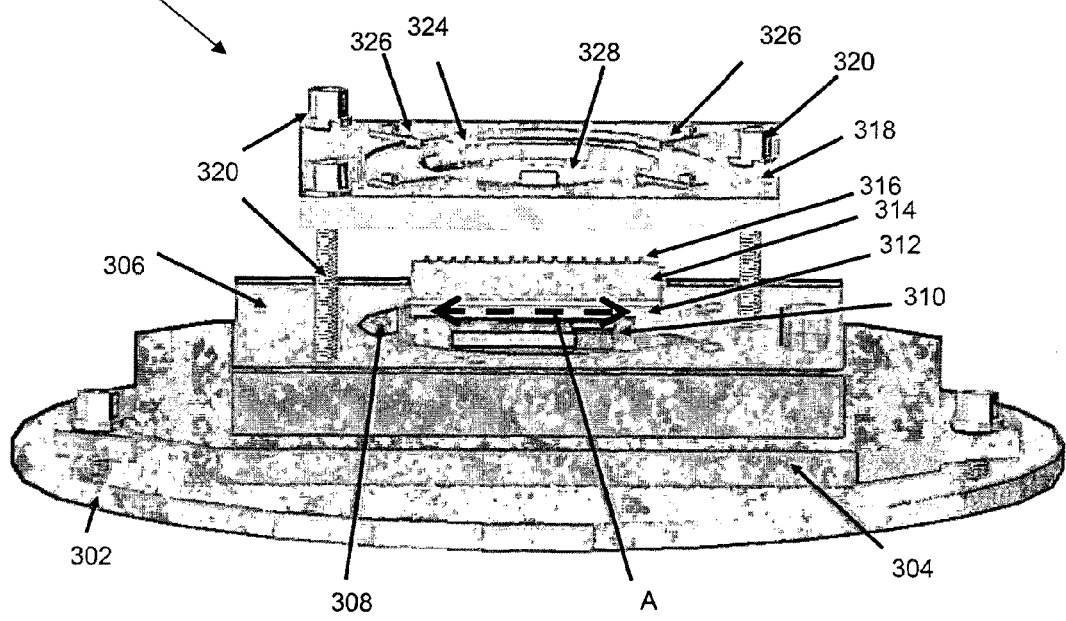

FIG. 3a is a top view of an X-ray lithography apparatus 300 having a double mask for performing an exposure stage of the lithography method according to an embodiment of the invention and FIG. 3b is a side perspective view of the apparatus 300. The apparatus 300 includes an X-ray scanner table 302 for supporting the rest of the components of the apparatus 300.

The apparatus 300 includes a holder plate 304 for carrying a sliding plate 306 having a central lower area 308 for carrying a micro-translation stage 310. The micro-translation stage 310 is arranged to support a substrate table 312 for carrying a radiation-sensitive resist and in this embodiment, the resist includes a Poly Methyl MethylAcrylate (PMMA) resist 314 which comprises multiple layers of PMMA sheets that performs like a positive resist. When the PMMA resist 314 is exposed to radiation, the exposed portions absorb the radiation and this causes a decrease in molecular weight of the irradiated PMMA resist, specifically at the exposed portions. This radiation-induced chain scission creates different solubility between irradiated and non-irradiated portions of the PMMA resist 314 in a developer solution. In other words, development rate of the irradiated portions of the PMMA resist 314 is much higher than that of the non-irradiated portions and the level is dependent on the dosage or level of radiation received.

The micro-translation stage 310 is arranged to move the PMMA resist 314 linearly or horizontally as shown by arrows A of FIG. 3b.

A first mask 316 is aligned and arranged on top of the PMMA resist 314 and the relative position of the first mask 316 and the PMMA resist 314 is fixed.

The apparatus 300 further includes a mask holder plate 318 suspended above the PMMA resist 314 by three micrometer screws 320 which separate the mask holder plate 318 and the PMMA resist 314 by a desired distance. The mask holder plate 318 has a circular central opening 322 arranged to receive a mask holder ring 324. The mask holder ring 324 is supported by the mask holder plate 318 using a number of mask holder mounting clamps 326 which clamp the mask holder ring 324 to the mask holder plate 318. The mask holder ring 324 is arranged to support a second mask 328. It should be appreciated that the desired distance between the PMMA resist substrate 314, the so-called proximity gap, (and thus, the first mask 316) and the second mask 328 should be at an optimum distance to allow for high pattern transfer accuracy and the distance is varied by adjusting the micrometer screws 320.

Figure 4:
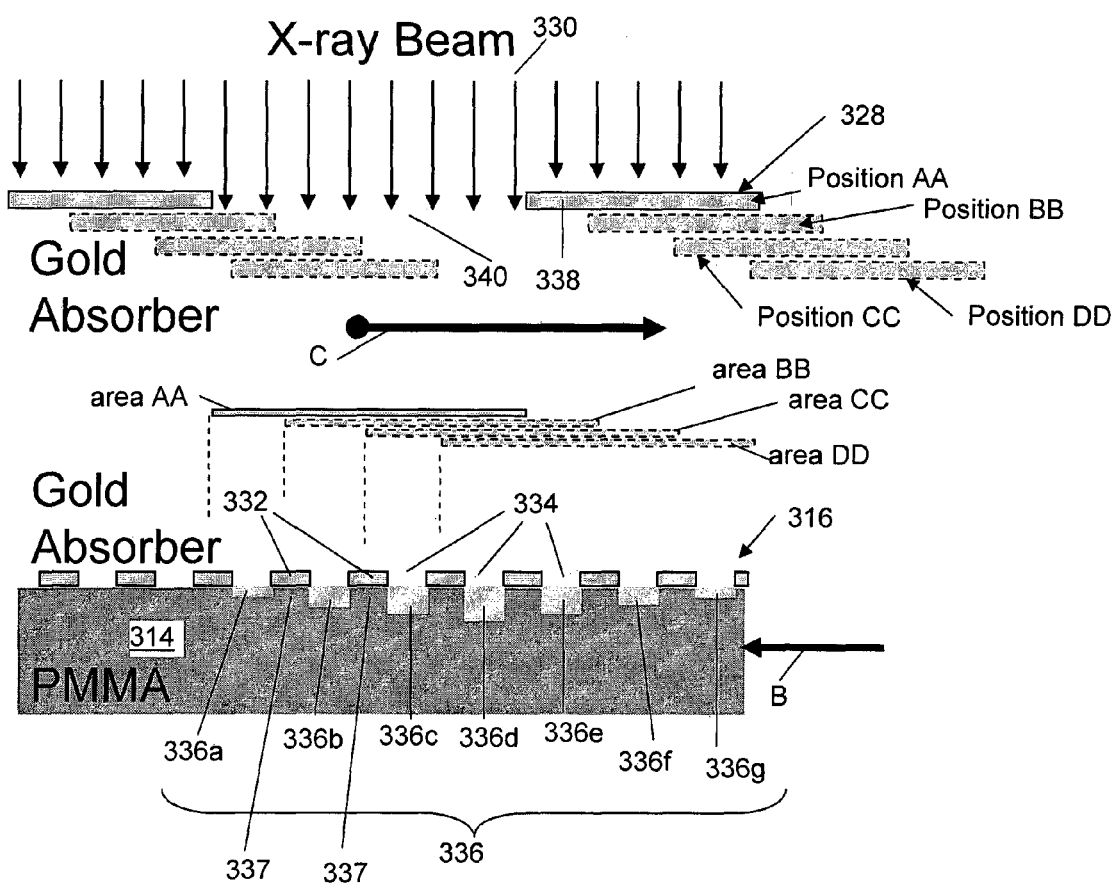
FIG. 4 is a simplified schematic of the exposure stage performed by the apparatus of FIGS. 3a and 3b for an exemplary case of using X-rays.

FIG. 4 is a simplified schematic illustrating the X-ray lithography method performed by the apparatus of FIGS. 3a and 3b. As illustrated in FIG. 4, the motion of the first mask 316 and the second mask 328 are correlated with each other during irradiation by an X-ray beam 330 from an X-ray light source (not shown) to allow precise selection of exposure areas of the PMMA resist 314. The apparatus 300 is arranged so that the PMMA resist 314 is typically perpendicular to the incident X-ray beam 330. However, in special cases, an inclination angle between X-ray beam 330 and apparatus 300 is also possible and useful.

To elaborate the exemplary MMA case, the first mask 316 is attached directly on top of the PMMA resist 314 and includes first portions 332 which block the X-ray beam 330 (after being masked by the second mask 328) from passing through to the PMMA resist 314 and second portions 334 which allow the X-ray beam 330 to pass through to irradiate corresponding portions 336 on the PMMA resist. In other words, the arrangement of the first and second portions 332, 334 creates a specific exposure or geometric pattern on the PMMA resist 314 and in this embodiment, the pattern is intended to form a lamellar structure on the PMMA resist 314.

The second mask 328 is used to vary characteristics of the exposure pattern so that the exposure can be additionally structured spatially and in this embodiment, the second mask 328 includes first mask portion 338 which blocks the X-ray beam 330 and second mask portion 340 which basically is an open aperture that allows the X-ray beam 330 to pass through as a masked X-ray beam 330. In this way, the second mask 328 is configured to deliver a confined and uniform dosage beam profile to the first mask 316 (and thus, the PMMA resist 314) so as to create step structures or profiles within the lamellar structure caused by the geometric pattern formed by the first mask 316.

As explained earlier, the masked X-ray beam 330 is further masked by the first mask 316 to irradiate the specific pattern on the PMMA resist 314 and in this case, a series of parallel channels. The first mask 316 includes first portions 332 which block radiation in the form of X-ray beam 330 from an X-ray light source (not shown) and thus, non-irradiation portions 337 underneath these first portions 332 are not exposed to the radiation, and second portions 334 which allow the X-ray beam 330 to pass through to irradiate corresponding portions 336 on the PMMA resist.

As shown in FIG. 4, at Position AA, the masked X-ray beam 330 irradiates an exposure area AA on the first mask 316 and the PMMA resist 336 for a predetermined exposure time to create desired depth profile on the irradiated portions 336 but not the non-irradiated portions 337 masked by the first mask 316. After the predetermined exposure time has lapsed, the first mask 316 together with the PMMA resist 314 are moved linearly in the direction B under exposure to the X-ray beam 330 by actuating the micro-translation stage 310 to move the substrate table 312 (and thus the resist 314 and the first mask 316) in e.g. 600 µm steps. The effect of shifting or moving the first mask 316 in the direction of B relative to the static second mask 328 is that the second mask 328 is shifted from Position AA to Position BB in the direction C as shown in FIG. 4.

Of course, the same effect may be achieved by a reverse arrangement and movement—shifting the second mask 328 linearly while keeping the first mask 316 and the PMMA resist 314 static or stationary. This may be achieved by an appropriate modification to the setup of the apparatus 300.

Coming back to FIG. 4, the shift in the relative positions of the first mask (and the PMMA resist 314) and the second mask, corresponds to exposure area BB and this overlaps with exposure area AA such that a first PMMA portion 336a is no longer irradiated but three PMMA portions 336b,336c,336d continue to be irradiated. Further, a fifth PMMA portion 336e is irradiated when the second mask 316 is in Position BB. After a predetermined exposure time, the first mask 316 and the PMMA resist 314 is again moved during exposure from Position BB to Position CC, and subsequently to Position DD and these positions create corresponding exposure areas CC and DD. It should be appreciated that the shifting of the first mask 316 relative to the second mask 328 through these positions enables the various portions 336b,336c,336d,336e, 336f,336g to be subjected to varying amounts of exposure time since the second mask 328 is arranged to shield those irradiated portions 336 which should not be subject to further radiation.

The end effect is that varying depth profiles of the irradiated portions 336 corresponding to the different exposure times are created on the PMMA resist 314.

Figure 5A:
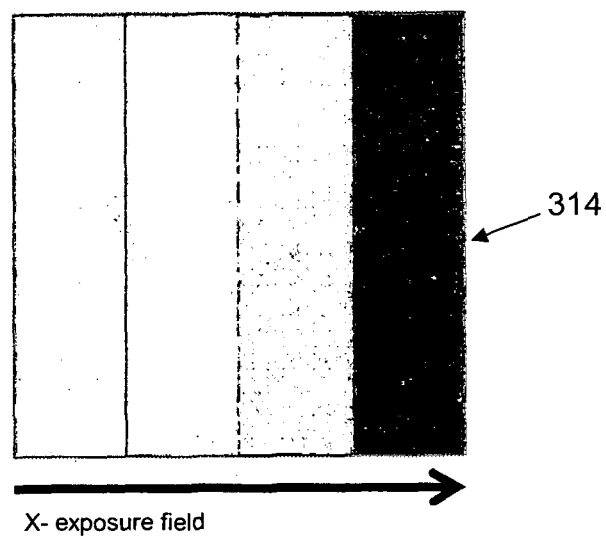
FIGS. 5a and 5b illustrate X-axis and Y-axis exposure field movements performed by one of the masks of FIG. 4.
Figure 5B:
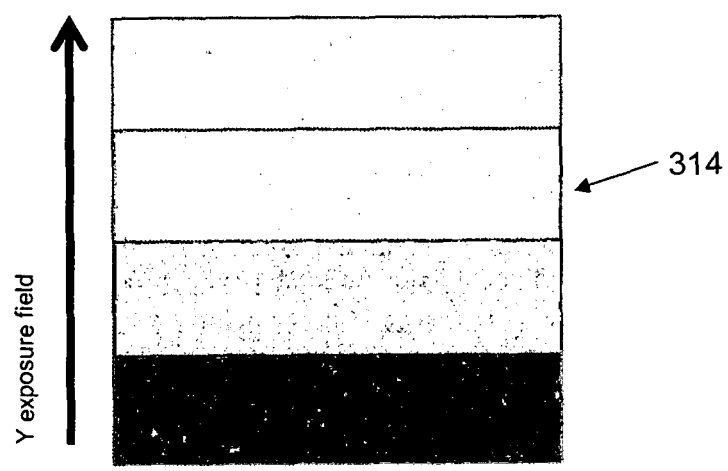

The movement of the first mask 316 and the PMMA resist 314 in the direction B relative to the second mask 328 may be considered as movement along an X-exposure field or X-axis with reference to the PMMA resist 314 as shown in FIG. 5a. Referring to FIG. 2 as an example, the X-exposure field movement is thus to create varying depth profiles in the X-axis of the multilevel structure such as the MMA 200. For creating varying depth profiles in the Y-axis of the multilevel structure, the micro-translation stage 310 is arranged to shift the first mask 316 and the PMMA resist 314 in a Y-exposure field or Y-axis which is orthogonal to the X-axis as shown in FIG. 5b.

Figure 6:
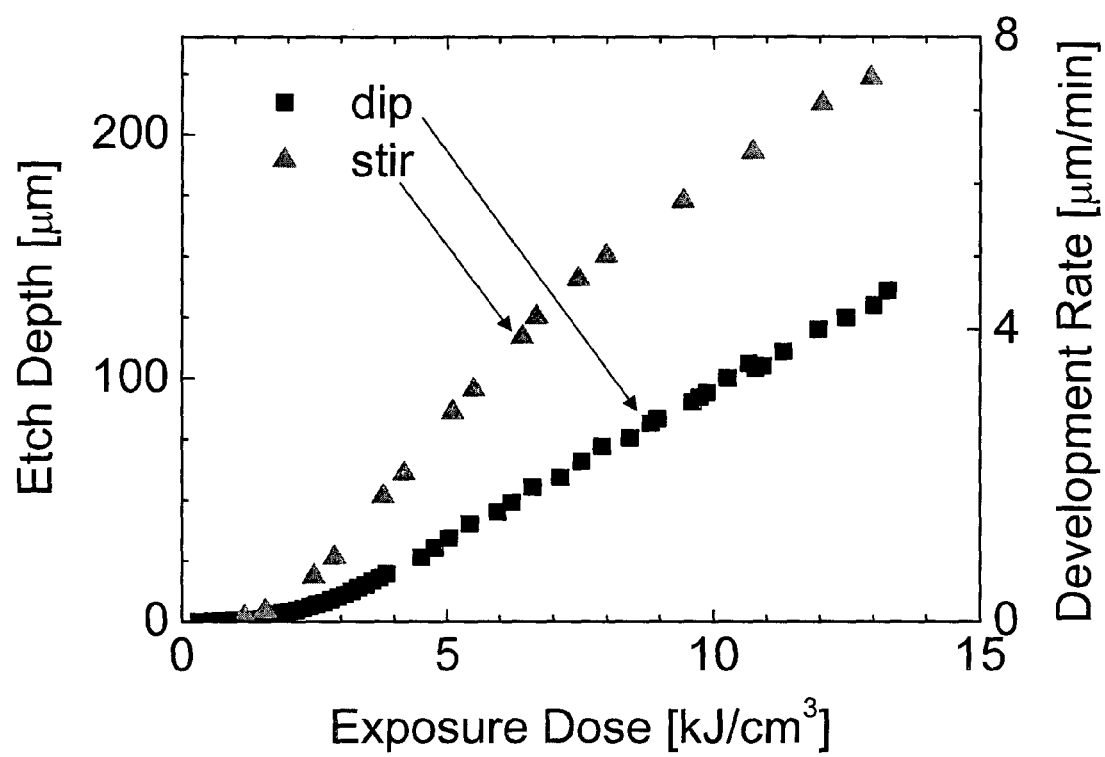
FIG. 6 is a graph illustrating relationships between etched depth, exposure dose and development rate (as derived from the etched depth) during the exposure stage illustrated in FIG. 4 for an exemplary case of polymethylmethacrylate (PMMA) resist irradiated by X-rays.

After the exposure stage, the exposed PMMA resist 314 is removed from the apparatus 300 and is subjected to a resist development stage in which the exposed PMMA resist 314 is immersed in a suitable developer solution in which the irradiated portions 336 of the PMMA resist 314 are dissolved in the developer solution at a much faster development rate than the non-irradiated portions. The resulting development- or etch-depth is dependent on the dosage profile during the exposure stage, the developer solution and the development conditions. A relationship for two types of development, namely stir and dip development, for a 30 minute development cycle at a solution temperature of 30° C. is shown in FIG. 6. The development time and the exposure dose translate into the depth profile under given development conditions and thus determine the depth profiles of the irradiated portions 336.

From the etch depth vs exposure dose relationship of FIG. 6, it is possible to derive relationship between development rate and exposure dose for the dip and stir developments illustrated with a second ordinate on the right-hand side of FIG. 6.

Figure 7:
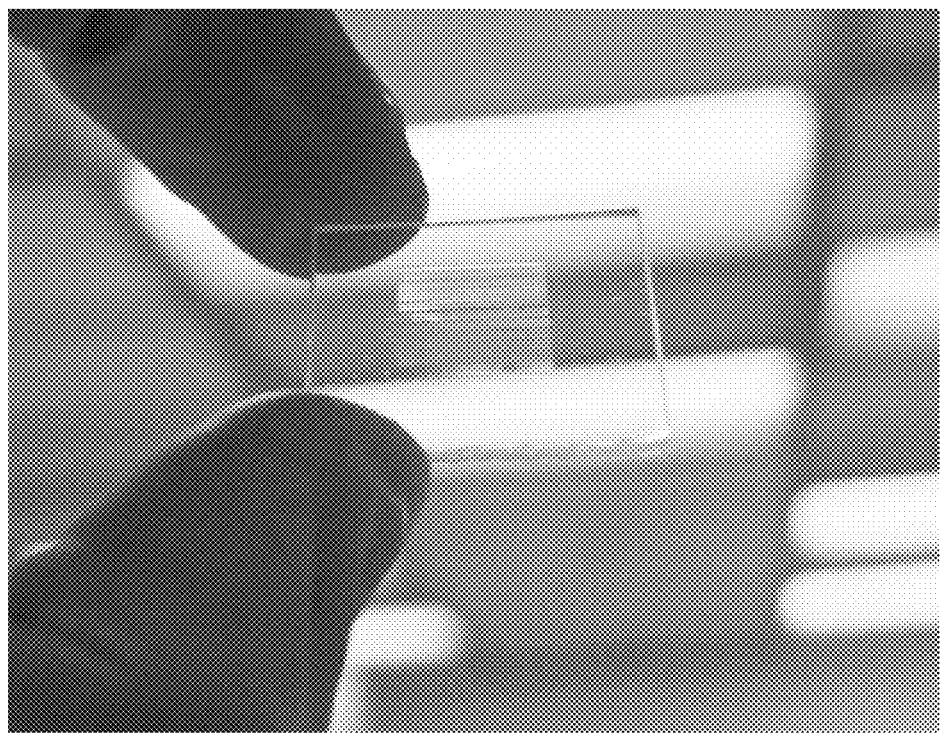
FIG. 7 is a photograph of an etched 3-dimensional structure obtained form the method of FIG. 4.

After the development stage, the PMMA resist 314 reveals a 3-dimensional structure having multilevel surfaces having varying depths or steps. FIG. 7 is a photograph of the etched 3-dimensional structure.

The etched 3-dimensional structure is then used to create a metal mould via electroplating and the metal mould is then used to reproduce 3-dimensional structures such as the MMA 200 (actually, these would be mirror images of the etched 3-dimensational structure) via embossing or injection moulding which would be a much more cost effective way of mass producing 3-dimensional structures, particularly micro or nano 3-dimensional structures having multi-level surfaces or steps of varying depths or heights. It should be clarified that while developing/prototyping of the 3-dimensional structures (eg. the MMA 200) via lithography directly is possible but for high volume production, moulding (such as plastic moulding) is preferably used.

Figure 8:
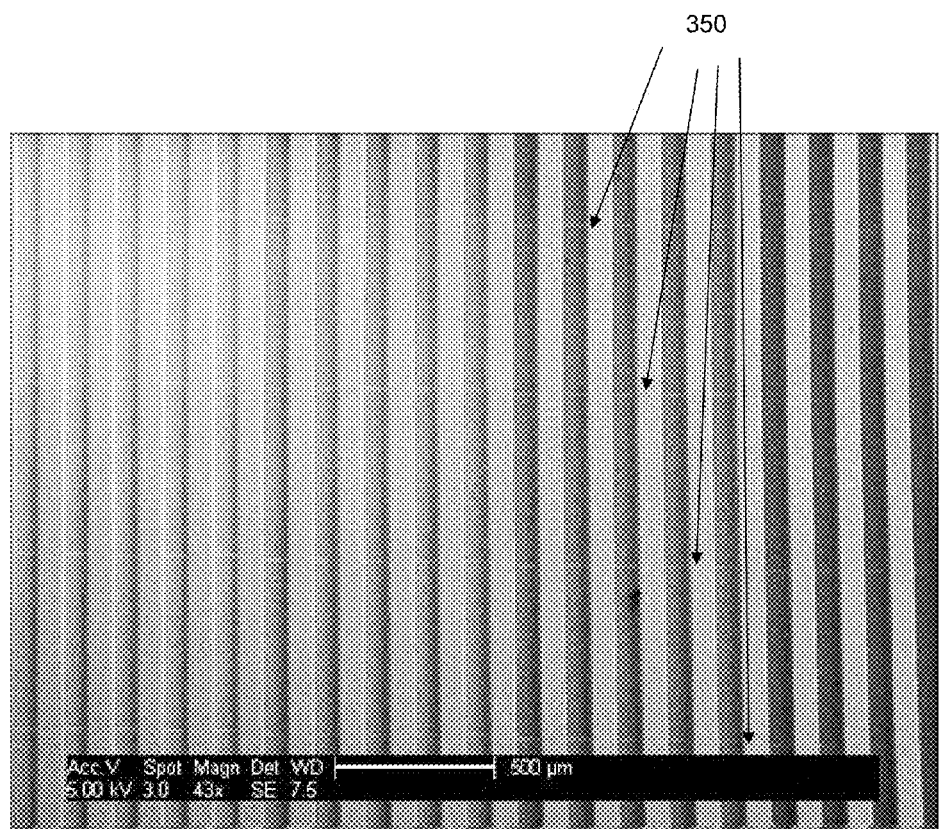
FIG. 8 is a scanning electron microscope (SEM) image of a MMA fabricated from the etched 3-dimensional structure of FIG. 7.

FIG. 8 is a SEM image of a fabricated MMA according to the above proposed method comprising 4×5 cells—5 rows of cells which are vertically separated by four horizontal lines 350 and horizontally 4 columns of cells as given by the cell size (in this case of 600×600 µm$^2$) or as can be found from the change in the grey level of the image.

As it can be appreciated, the proposed lithography method of this embodiment enables precise selection of exposure areas. The method uses two stacked masks 316,328 of which at least one is movable independently with respect to the other. In this embodiment, the first mask 316 provides an overall geometric shape or exposure pattern of a structure (i.e. a lines-and-spaces structure for this embodiment) and the second mask 328 arranged on top of the first mask 328 enables selective irradiation of where to irradiate, when and for how long which portions of the resist 314 is irradiated by appropriate shielding of the radiation beam: The exposure areas may be as large as a primary (2D) pattern as defined by the first mask 316 (perhaps cm-range, depending on the exposure system and application) or as small as the movement of the translation stage 310 allows it (sub-microns).

The described embodiment should not be construed as limitative. For example, in the described embodiment, the first mask 316 and the PMMA resist 314 are shifted linearly relative to the position of the second mask during irradiation or exposure so that areas of the PMMA resist 314 is selectively moved into shadow regions of the second mask 328 (i.e. under the first mask portions 338 which may be called absorbers) allowing deposition of dose grey levels in those areas exposed to the X-ray beam 330. However, the same effect may be achieved if the positions of the first mask 316 and the PMMA resist 314 are static and the second mask 328 is shifted instead by suitable modification to the apparatus 300. Also, it is envisaged that both masks 316,328 may be configured to move.

The first mask 316 may not be directly attached to the PMMA resist 314 and may be spaced therefrom. Also, the positions of the first mask 316 and the second mask 328 along the vertical may be swapped accordingly i.e. the second mask 328 being immediately adjacent to the PMMA resist 314 whereas the first mask 316 being above the second mask 328.

Figure 9:
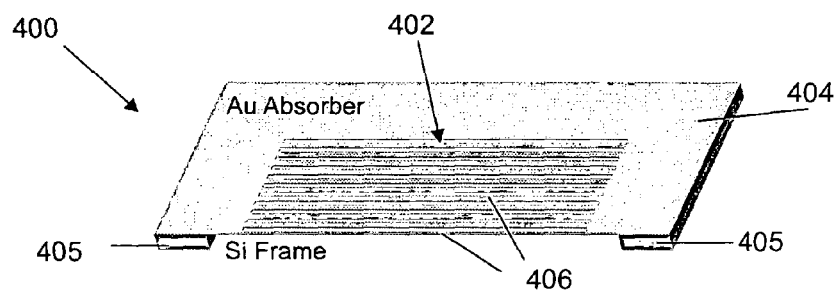
FIG. 9 is a magnified perspective view of a stencil mask which may be used with the apparatus of FIGS. 3a and 3b.

In this embodiment, the first mask 316 is a standard lithography mask (having a clear membrane to allow the light beam to pass through, supporting patterned structures, preferably made from metal, which have near zero transmittance for the radiation) which is next to the PMMA resist 314 and the second mask 328 used to 'open and close' the first mask areas to the irradiation beam 330 at a given time and for a given exposure duration. However, the first mask and/or the second mask may be stencil masks which means that "open" areas are through apertures without any membrane such as the stencil mask 400 shown magnified in FIG. 9. The stencil mask 400 has a 10×10 mm² X-ray stencil mask area 402 held by a silicon mask frame 404 and supported by a silicon frame 405. The mask area 402 includes a series of spaced apart longitudinal gold members 406 freely suspended by the silicon mask frame 404, instead of being supported by an underlying membrane layer. The longitudinal gold members 406 correspond to the first portions 332 of the first mask 316 which absorbs or prevents radiation from passing through and the channels between the gold members 406 corresponds to the second portions 334 of the first mask 316 which allows radiation to pass through. This avoids any influence on the X-ray beam 330 by the membrane layer and thus, improves the lithography quality resulting in a better 3-dimensional structure.

The described embodiment uses the PMMA resist 314 for forming a monolithic multilevel structure but other resist material, polymers or substrates may also be used depending on the spectral range of the radiation and other process requirements.

Figure 10:
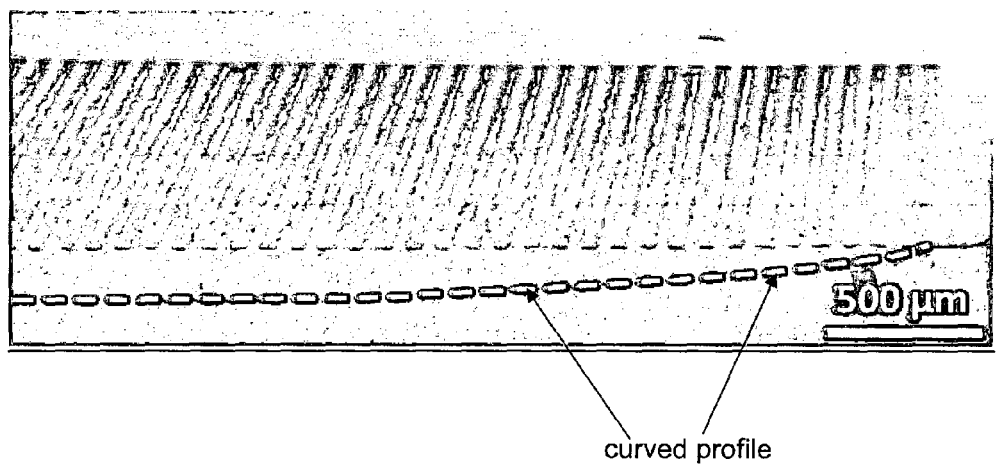
FIG. 10 is a SEM image of a 3-dimensional structure having a curved base profile.

In the described embodiment, the first mask 316 and the PMMA resist 314 move together in a step motion to generate a 3-dimensional structure having step profiles but it should be appreciated that the first mask 316 and the PMMA resist 314 may be arranged in a continuous sweeping or scanning motion to generate continuous surface profiles. For example, if the sweeping motion changes the relative position between the second mask 328 and the first mask 316 (and thus, the PMMA substrate 314), this causes changes in the level of exposure to the X-ray beam 330 and this may be used to create a curved mirror grating. In the alternative, the second mask 328 may be replaced by a curved 2-dimensional mask and the curvature of the mask thus creates corresponding changes in the relative positions between the curved mask and the first mask 316 and the PMMA resist 314. The relative positions between the masks which "close or open" exposure areas on the resist thus enables different level of doses to be deposited i.e. time duration of constant intensity exposure. This results in corresponding different intensities of exposure to the X-ray beam 330 and together with scanning of the curved mask in the Y-direction results in a curved dose profile. A SEM image of a 3-dimensional structure having a curved base profile is shown in FIG. 10 with an imaginary line (in white) to illustrate the curved profile clearly.

Instead of X-ray lithography, other types of lithography may be used, for example Deep X-ray lithography (DXRL), UV lithography, and electron or ion beam lithography.

Figure 11:
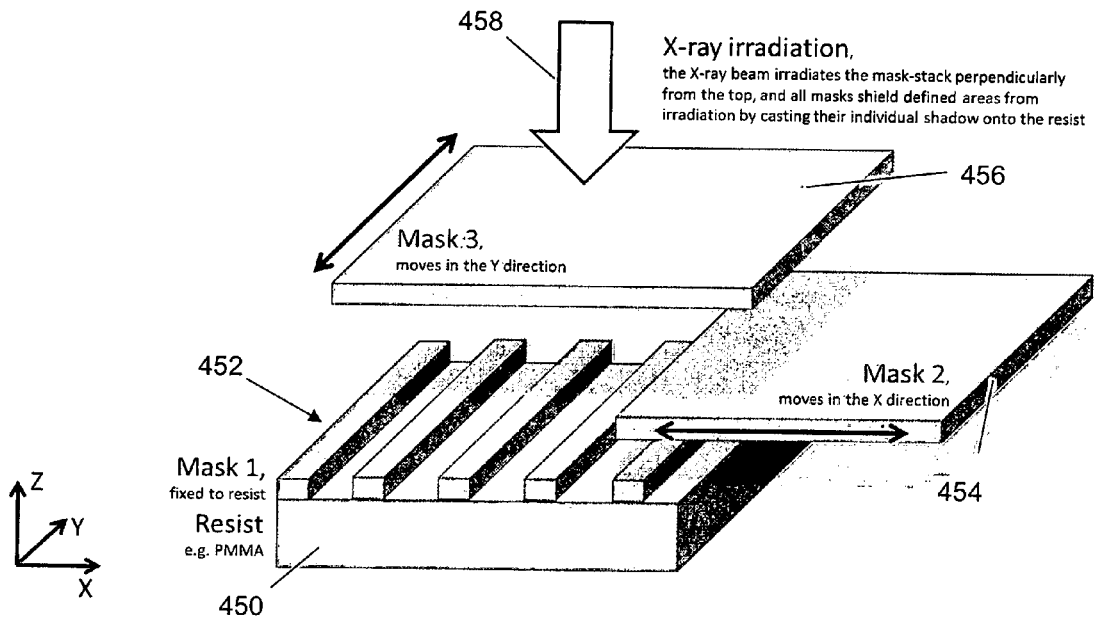
FIG. 11 is a simplified schematic of an apparatus having three masks for performing an exposure stage of the lithography method for forming multilevel surfaces such as the MMA of FIG. 2.

Instead of having two masks 316,328 which are configured to change positions relative to each other, it is envisaged that more masks may be used. For example, a third mask may be included. Such an arrangement of "multiple" moving mask technique is shown in FIG. 11 and just like the described embodiment, the resist is in the form of a PMMA resist 450 and a first mask 452 is aligned and attached to the top surface of the PMMA resist 450. The first mask 452 has a similar structure as the first mask 316 of the described embodiment. A second mask 454 and a third mask 456 are suspended above the first mask 452 in different Z coordinates to selectively shield an X-ray beam 458 from irradiating onto selected portions of the PMMA resist 450. Both masks 454,456 may simply be a plate with its entire area configured to prevent radiation from passing through and thus, when the masks 454,456 are shifted offset to the X-ray beam 458, the beam passes through the sides of the plate. The second mask 454 is arranged to shift or move along an X-axis and the third mask 456 is arranged to move along a Y-axis, relative to the positions of the first mask 452, the PMMA resist 450 and the X-ray beam 458. In this way, the second and third masks 454,456 enable selection of which portions of the PMMA resist 450 to irradiate depending on which portions are shielded. For example to create a 3 dimensional structure, the first mask 452 provides the overall geometric pattern for the PMMA resist 450 and the first mask 452 is first exposed to the X-ray beam 458 with the mask 3 fully withdrawn so that it does not shield the X-ray beam 458. During continued exposure to the X-ray beam 458, the second mask 454 is next moved step-wise or at intervals along the X-axis across the irradiation area to selectively shield parts of the PMMA resist 450 (as exposed by the first mask 452) from being irradiated by the X-ray beam 458. Once the X-direction scan is done, the second mask 454 is moved away and the third mask 456 is activated to move step-wise along the Y-axis which is orthogonal to the X-axis. In this way, this exposes selected parts of the PMMA resist 450 to the irradiation beam along the Y-axis to create various depth profiles in that direction.

Figure 12:
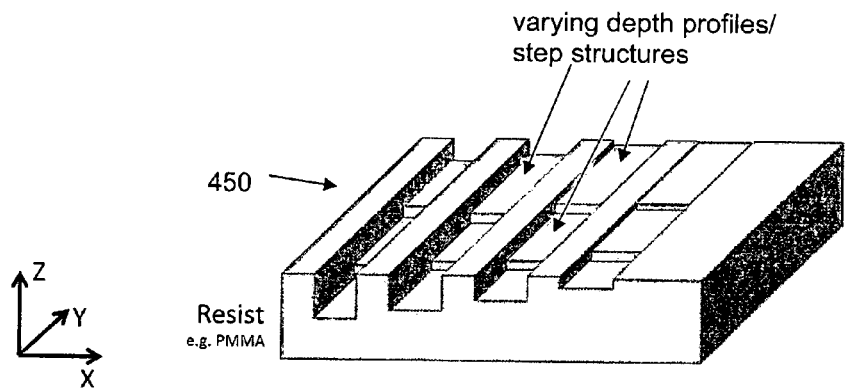
FIG. 12 shows a simplified etched structure obtained from the lithography method of FIG. 11.
Figure 13:
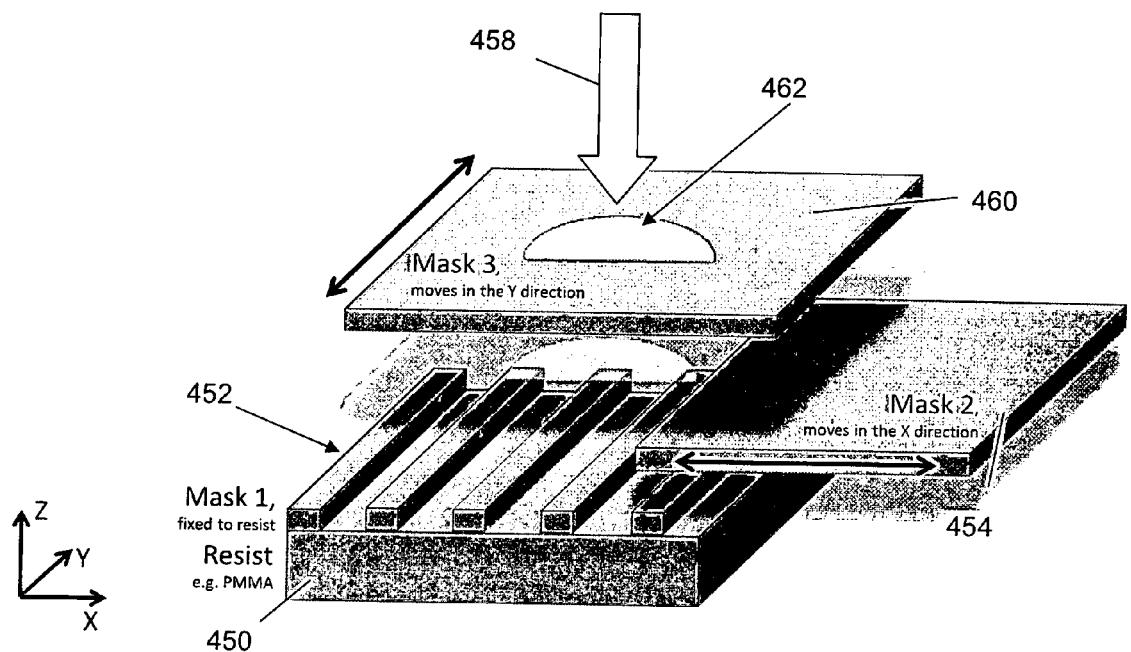
FIG. 13 is a simplified schematic of a further apparatus having three masks for performing an exposure stage of the lithography method for forming multilevel surfaces having curved depth profile.

After exposure, the irradiated PMMA resist 450 is likewise developed in a developer solution to remove the irradiated areas and a simplified schematic of a developed resultant PMMA structure 450 formed by the procedure of FIG. 11 is shown in FIG. 12 and the varying depth profiles or step structures should be observed. The depth of a step structure depends on the total dose received or total exposure time during the exposure and the development.

It should be appreciated that the relative movement between the masks 452,454,456 may be performed by shifting the second and/or third masks 454,456 independently or by moving the stack of the first mask 452 and the PMMA resist 450 in X and Y directions behind a static/fixed stack of the second and third masks 454,456. Either way, the relative movement of the masks enables a step-like structure to be produced with a given primary pattern (lines and spaces) as required for the MMA 200.

The method may also be adapted to produce more complex or arbitrary structures such as 3-dimensional structures with selected curve base profiles or half spheres. Using the example of FIG. 11, this may involve replacing the third mask with a fourth mask 460 having a semicircular aperture 462 which allows radiation to pass through but not the other parts of the fourth mask 460. Similarly, the first mask 452 provides the basic geometric pattern on the PMMA resist 450 and the second mask 454 is operable to move step-wise linearly in the X-direction during exposure to the X-ray beam 458. Further, the fourth mask 460 is scanned or dragged continuously across the first mask 452 and the PMMA resist 450 in the Y-direction under exposure to the X-ray beam 458.

Figure 14:
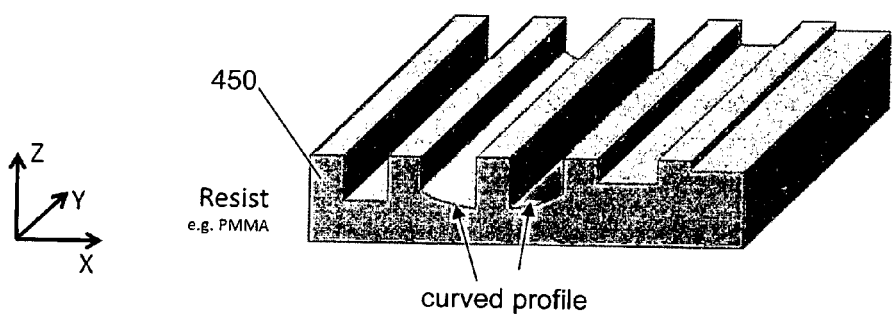
FIG. 14 shows a simplified etched structure obtained from the lithography method of FIG. 13.

With the fourth mask 460, selected irradiation areas of the PMMA resist 450 may have a curved profile and an example is illustrated in FIG. 14, after irradiation and subsequent resist development.

Figure 16:
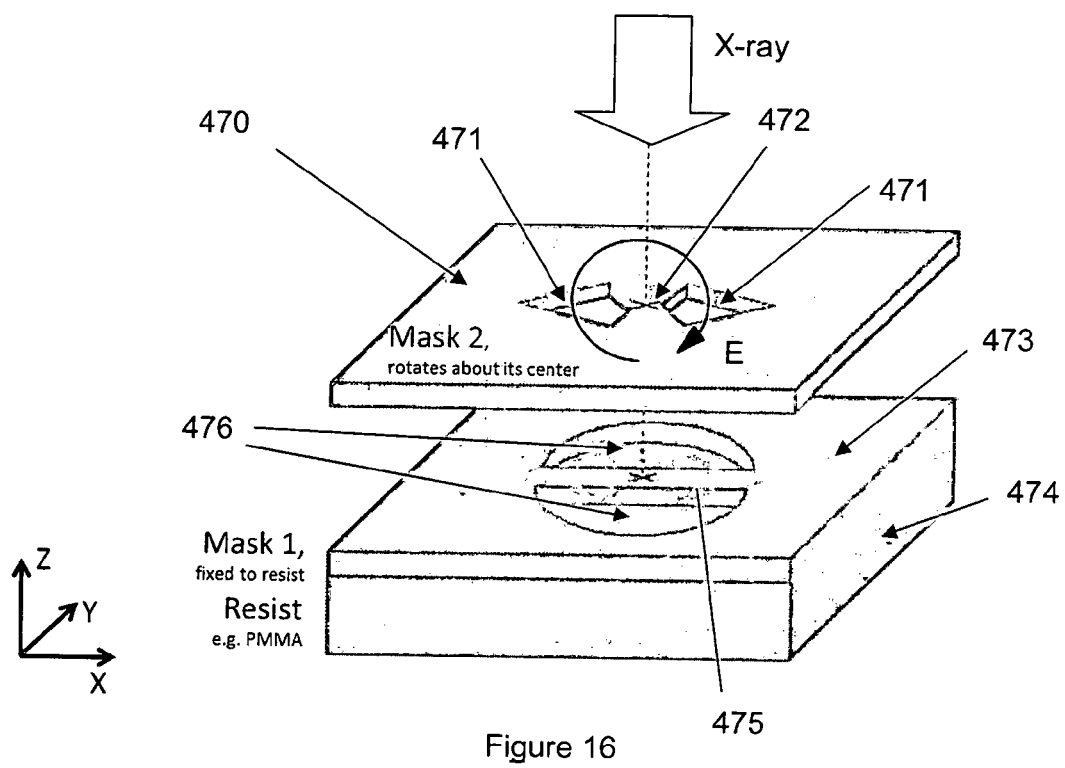
FIG. 16 is a simplified schematic of an even further apparatus having a mask featuring two lozenge-shaped apertures arranged to rotate about a central point to irradiate a resist.
Figure 17:
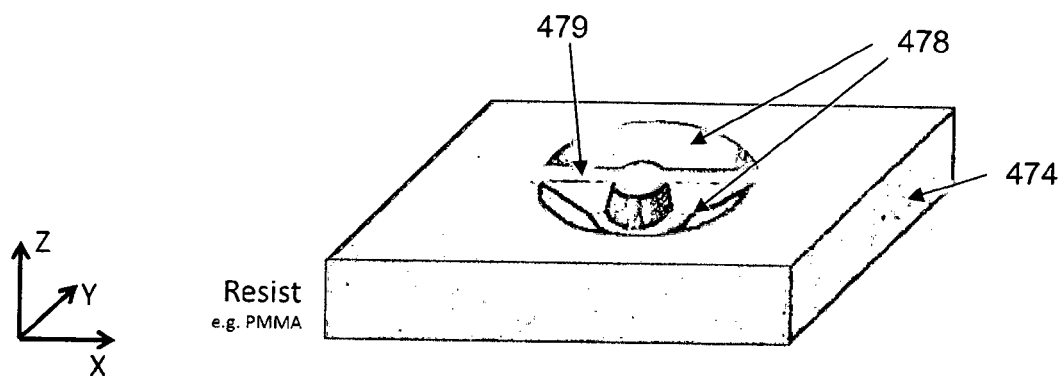
FIG. 17 shows a simplified etched structure obtained from the resist of FIG. 16 after irradiation and developing the resist.

A further example is illustrated in FIG. 16 which has a mask 470 featuring two lozenge (or commonly referred to as diamond shaped) cut-outs or apertures 471 attached to a common member or point 472 arranged to rotate the mask 470 about the central point 472 in the direction of arrow E. The lozenge mask 470 is arranged above and spaced from a stencil mask 473 deposited on a surface of a PMMA resist 474 and the structure of the stencil mask 473 includes one elongate gold absorber ribbon 475 that runs diametrically with respect to the central point 472 and includes two semi-circular apertures 476 on each side of the ribbon 474. The rotating mask 470 thus blocks or exposes an X-ray source from irradiating the PMMA resist 474 depending on speed of rotation and an exposure pattern corresponding to the exposure dose and the shape of the mask 470 is thus formed in portions of the resist 474 exposed by the stencil mask 473. FIG. 17 shows a result of developing the irradiated resist of FIG. 16. The exposure pattern created by the change in relative positions between the lozenge mask 470 and the stencil mask 473 includes an annular inverted conical depression 478 with one diametrically separating wall 479.

It should be appreciated that the mask 470 may just have one lozenge aperture 471 instead of two to create a similar etched structure as FIG. 17 with appropriate adjustment of the exposure time, for example, doubling of the exposure time. Further, the number of lozenge apertures may also be increased to three, four or more, limited by the size of the mask 470 with the maximum number of apertures reached when the apertures touch each other.

Figure 15:
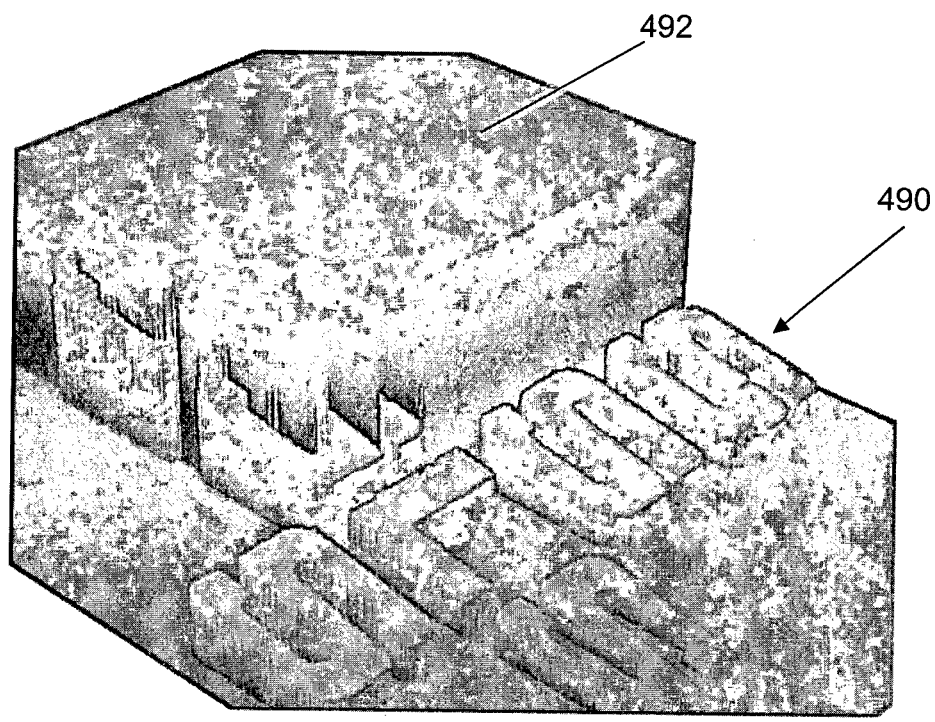
FIG. 15 is an image of an etched 3-dimensional microstructure having letters SSLS as taken with an optical profiler.

It should be appreciated that other complex or arbitrary multilevel structures with high resolution and high-aspect-ratio structures such as the one shown in FIG. 15 which is a 3D plot of an optical profiler of the letters "SSLS" microstructure etched into a PMMA resist with minimum depth stepping of approximately 100 nm. The width of a single letter is approximately 450 μm and the depth varies from 12 μm to 28 μm in steps of approximately 100 nm. A resist top surface profile is cleared from most of the plot for better visibility of the steps and the letters 490 within the PMMA sheet. Part of the top surface, the top left corner 492 of the resist is maintained and serves as a reference.

As it can be appreciated from the above examples, the sub-micrometer depth resolution of the proposed fabrication technique is superior to common ruling, micro-turning or cutting techniques. Moreover, the fabrication technology using lithography allows the fabrication of 3-Dimensional structure shapes impossible to be machined with conventional fabrication techniques. If the light source uses synchrotron based X-ray exposure of PMMA surfaces, this results in superior surface quality. By having at least two masks which are movable independently allows:

fabrication of complex 3-Dimensional geometries by using at least one fixed and one moving mask. The use of a movable mask in combination with a fixed mask, allows independent controlling of the depth profile of 2-dimension geometries given by the fixed mask pattern.

transfer of lithographic pattern over large surface areas, since most of the available beam produced by X-ray sources can be utilized in parallel. This reduces costly exposure times.

exposure of different geometries in parallel.

tailoring of the bottom surface of etched planes within the mask one structure by using sides of the mask (or absorber layer) scanned in smallest steps across the resist profile, or scanned across a fixed mask pattern (fabrication of inclined etch-surfaces), or by using the mask to permit or block irradiation of different exposure areas during exposure (fabrication of leveled etch-surfaces).

The 3-dimensional structuring provided by the proposed technique is able to produce surfaces of high optical quality. The synchrotron X-ray irradiation beam directed at the resist (or PMMA resist) is able to create well-defined and sharp sidewall profiles of the lamellar structure of the grating, in particular the bottom surfaces of the etched planes are orthogonal to sidewalls of the lamellar structure.

The developed lithography technique combines both, creating a stepped structure within the lamellar structure, in one polymer structure or monolithic structure. As such, no additional alignment steps of produced structures are necessary after the lithography. The working area of the technique can be as large as several $cm^2$ with depth profiles from 0 to the millimeter range. The X-Y structure dimension limitations are given by the conventional structure limitations of the specific lithography tool used.

As explained earlier, the proposed lithography method is particularly useful for producing the MMA 200 of FIG. 2 (or rather, to create a 3-dimensional structure for creating a mould for producing the MMA 200). When used as an optical tool, the MMA has no movable parts and is therefore superior to existing interferometers in terms of:

enabling spectroscopy of single short non-repetitive pulse signals by means of Fourier transform interferometry;

improving time resolution when measuring continuous wave signals;

removing the spectral sensitivity to vibrations (Since all interferometric data is collected at the same time instant the vibrations are the same for all data points and thus do not alter the data acquisition); and extending the mechanical lifetime of the device by having lesser mechanical parts, as compared to Michelson type interferometers.

Aside from the use of the fabrication technique to produce MMA's for the FPP FTIR, the 3D-lithographic technique may be used to machine components for other optical applications. Such components include phase-modulators for in-line digital holography or plane/curved mirror arrays for interferometric applications or analytic devices.

Examples of analytic devices which are broadly classified as spectrometers used in any application that calls for the analysis of substances are:

Chemicals in the chemical industry

Process analysis

Non-invasive analysis in biology and medicine

Drug development in the pharmaceutical industry

Environmental monitoring including the security and military industries

Identification and quantification of substances in the research and development market

Having now fully described the invention, it should be apparent to one of ordinary skill in the art that many modifications can be made hereto without departing from the scope as claimed.

The invention claimed is:

1. A proximity lithography method comprising (i) providing a first mask having an exposure pattern for forming a three dimensional structure;

(ii) directly exposing the first mask to radiation to form the exposure pattern on a radiation-sensitive resist; the exposure pattern defined by irradiated areas and non-irradiated areas of the resist;

(iii) providing a second mask; and (iv) during exposure, changing relative positions between the first mask and the second mask to shield selected portions of the irradiated areas from the radiation and to produce exposure dose grey levels in areas of the radiation-sensitive resist exposed to the radiation to enable features with varying depth profiles, which include a plurality of surfaces arranged substantially parallel to a surface of the resist exposed to the radiation, to be created in the three dimensional structure.

2. A lithography method according to claim 1, wherein the first mask is in contact with the resist.

3. A lithography method according to claim 1, further comprising changing the relative positions at intervals while maintaining positions during the exposure.

4. A lithography method according to claim 1, wherein changing the relative positions include maintaining the position of the second mask and moving together both the first mask and the resist.

5. A lithography method according to claim 4, further comprising moving both the first mask and the resist along a first movement axis and subsequently, along a second movement axis which is orthogonal to the first movement axis.

6. A lithography method according to claim 1, wherein changing the relative positions include maintaining the positions of the first mask and the resist, and moving the position of the second mask.

7. A lithography method according to claim 6, further comprising moving the second mask along a first movement axis and subsequently, along a second movement axis which is orthogonal to the first movement axis.

8. A lithography method according to claim 1, further comprising rotating the second mask about a central point.

9. A lithography method according to claim 8, wherein the second mask includes two opposing apertures.

10. A lithography method according to claim 9, wherein each of the opposing apertures is lozenge-shaped.

11. A lithography method according to claim 1, further comprising providing a third mask.

12. A lithography method according to claim 11, further comprising moving the second mask along a first movement axis and moving the third mask along a second movement axis which is orthogonal to the first movement axis, while maintaining the positions of the first mask and the resist.

13. A lithography method according to claim 1, wherein the exposure pattern includes a lamellar structure.

14. A lithography method according to claim 1, further comprising, after exposure, developing the resist in a developer solution to etch away parts of the irradiated areas to form the three dimensional structure having varying depth profiles.

15. A lithography method according to claim 1, wherein the radiation is X-ray.

16. A lithography method according to claim 1, wherein the resist is polymer.

17. A lithography method according to claim 1, wherein the resist is Poly Methyl MethAcrylate (PMMA).

18. A method of producing a micro or nano structure from a three dimensional structure obtained from the lithography method of claim 1.

19. A method according to claim 18, further comprising forming a mould from the three dimensional structure.

20. A method according to claim 19, further comprising producing the micro or nanostructure based on the mould.

* * * * *